United States Patent [19]

Schmauder

[11] Patent Number: 4,761,364
[45] Date of Patent: Aug. 2, 1988

[54] SCREEN PRINTING STENCIL FOR MAKING ELASTOMER SEALING LAYERS ON FLAT GASKET PLATES AND METHOD FOR MAKING SAME

[75] Inventor: Karl Schmauder, Hülben, Fed. Rep. of Germany

[73] Assignee: Elring Dichtungswerke GmbH, Fed. Rep. of Germany

[21] Appl. No.: 929,744

[22] Filed: Nov. 12, 1986

[30] Foreign Application Priority Data

May 16, 1986 [DE] Fed. Rep. of Germany ....... 3616697

[51] Int. Cl.$^4$ .............................................. G03F 7/12
[52] U.S. Cl. ................... 430/308; 430/309; 430/320; 101/128.21; 101/128.4
[58] Field of Search ..................... 430/11, 12, 15, 17, 430/308, 312, 320, 322, 325, 328, 394, 396, 309; 427/143; 101/128.21, 128.4, 129

[56] References Cited

U.S. PATENT DOCUMENTS 4,078,488 3/1978 Wright et al. ................... 101/128.4
4,216,019 8/1980 Reed et al. ........................ 427/143

FOREIGN PATENT DOCUMENTS 1217153 12/1966 Fed. Rep. of Germany.
1911555 9/1970 Fed. Rep. of Germany.
1600560 4/1975 Fed. Rep. of Germany.
2054804 4/1978 Fed. Rep. of Germany.

OTHER PUBLICATIONS

Handbuch für den Siebdruck, pp. 74–77 and an English Translation.

Primary Examiner—José G. Dees
Attorney, Agent, or Firm—Lorusso & Loud

[57] ABSTRACT

Screen printing stencil for making sealing layers of elastomer material on a flat gasket. A screen carrying a photoresist layer exhibits areas of increased height on the side with which it is made to contact the flat gasket, in order to simultaneously produce sealing layer areas of different thicknesses. To make such a screen printing stencil, its screen is first provided with a first photoresist layer in which areas are then delimited by means of adhesive tapes, following which these areas may be coated with a second photoresist layer. The desired screen printing stencil is then obtained by both photoresist layers being jointly exposed and the non-exposed areas of the photoresist material being washed out.

4 Claims, 4 Drawing Sheets

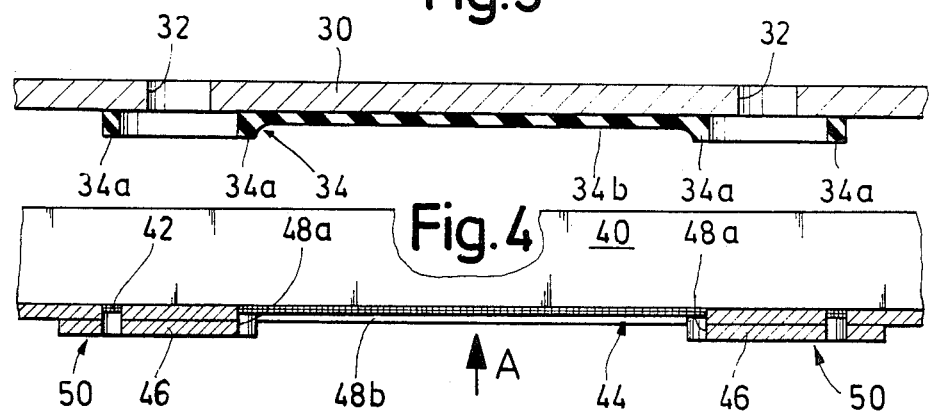
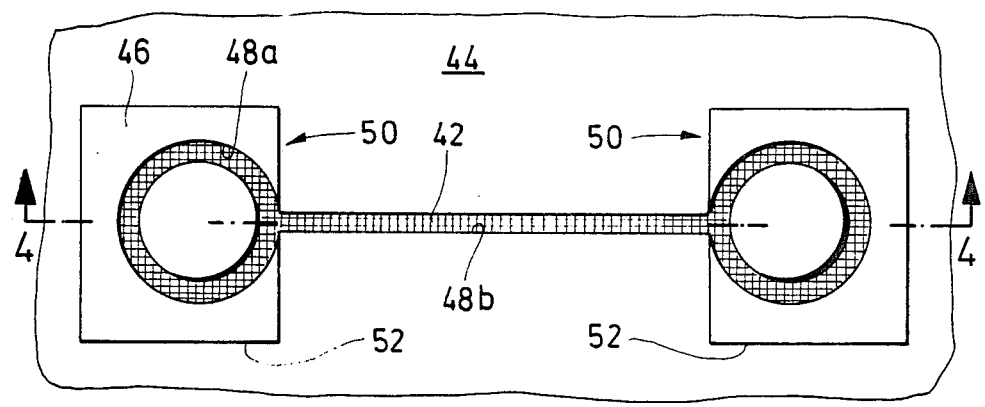
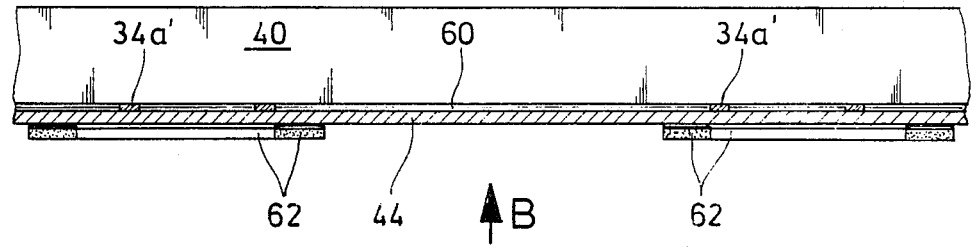

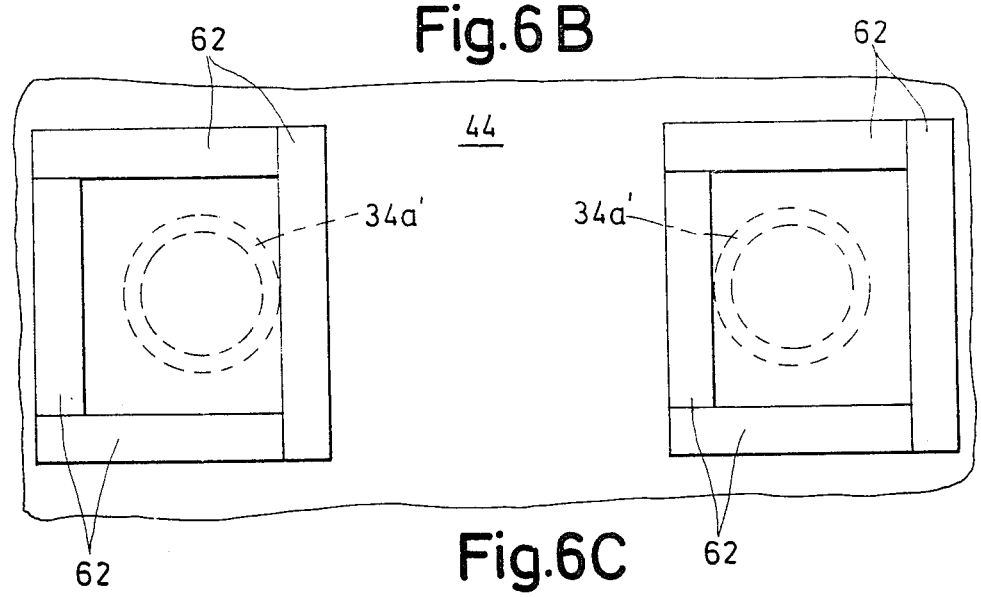
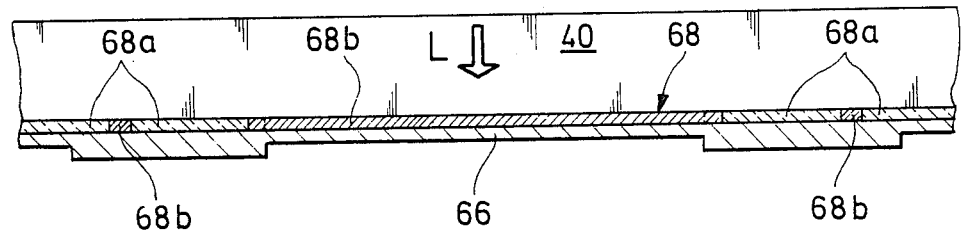
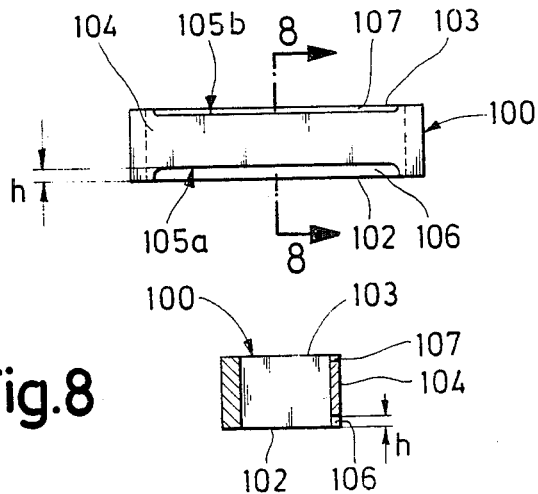

SCREEN PRINTING STENCIL FOR MAKING ELASTOMER SEALING LAYERS ON FLAT GASKET PLATES AND METHOD FOR MAKING SAME

In order to obtain a sufficiently high pressure providing a reliable sealing throughout the entire sealing surface of flat gaskets, in particular, cylinder head gaskets, it is known to partially coat the flat gasket plate with elastomer sealing material which is applied by the screen printing method and is subsequently given shape stability (see, for example, German Pat. No. 1 217 153). This method has proven to be of advantage, in particular, in cases where the forces introduced into a sealing connection by means of screws are inadequate to provide a sufficiently high pressure throughout the entire sealing surface. The supporting surface of a bead-shaped sealing layer applied by the screen printing method which, in comparison to the surface of a flat gasket plate, is small and at the same time constitutes a localized increase in the thickness of of the flat gasket, produces a higher sealing pressure with given screw forces at the sealing layer location. The actual flat gasket plate may end up acting merely as carrier of a configuration of sealing layers effecting the sealing.

The aim of producing a sealing pressure ensuring sealing throughout is not achieved in all flat gaskets if the elastomer sealing layers exhibit the same height or thickness throughout. Experts have for a long time sought to find a way of making one or several sealing layers of different height or thickness on a flat gasket without the precision of the sealing layers being impaired or other serious drawbacks having to be put up with. To date, they have not been successful in doing so, as is clearly evident from consideration of the state of the art:

The commonest method is that wherein the coatings are applied in succession by at least two screen printing stencils of different designs, with opening areas which are adapted to the configuration of the sealing layer areas of different thickness, and with screen fabrics with a different mesh number per cm$^2$ and, consequently, a different mesh size. Use of the screen printing stencil with the larger mesh size produces the sealing layer areas of larger height. This manufacturing method not only has the disadvantage that several screen printing stencils have to be made, stored and handled, but also unavoidably harbours the danger of the contours of the various sealing layer areas being misaligned since there is the risk of the second screen printing stencil not being placed onto the flat gasket exactly in line with the position of the first screen printing stencil thereon. If various screen printing stencils are used in superimposed relationship for the printing, not only the above-described fault, but also a fault propagation occurs in the layer thickness of the sealing layers: If a deviation $F_1$ from the set layer thickness occurs in the thickness of a sealing layer area when the screen printing is performed only once, then from a static point of view, according to the law of fault propagation, a deviation F from the set layer thickness of $F=\sqrt{F_1^2+F_2^2}$ will be obtained if the screen printing is performed twice. The aforementioned disadvantages are also not to be avoided by underlining the entire surface of a screen printing stencil in the known manner with photoresist in order to increase the thickness of the sealing layers since the manufacture of sealing layers having a partially different layer thickness then again necessitates a second application by means of a second screen printing stencil with an opening configuration corresponding to the configuration of the sealing layer areas of increased layer thickness.

It is also known to influence the layer thickness by the width of the through openings of a screen printing stencil, but this has the disadvantage that a certain thickness or height of the sealing layer unavoidably requires a corresponding sealing layer width, which is highly detrimental to optimal sealing layer design. The influencing of the thickness or height of the sealing layer by the width of the through openings is, furthermore, only possible in a narrow width range and is highly dependent on further parameters, namely screen design, doctor blade speed, doctor blade contact angle and contact pressure, and also on the rheological properties of the elastomer material used in making the sealing layers (see German Pat. No. 2 054 804).

This concludes the principal proposals apparent from the state of the art since further known methods fail to disclose any new basic approaches, but instead constitute mere variants of the known techniques described in detail hereinabove. This applies, for example, to German Pat. No. 1 217 153 and German Pat. No. 1 600 560 since the successive use of stencils of different thickness or the use of two superimposed screens similarly fails to eliminate the above-mentioned drawbacks, as either the flat gasket must be partially printed several times and/or at least two stencils would require exact positioning relative to each other and to the flat gasket plate.

The object underlying the invention was, therefore, to provide means enabling elastomer sealing layers of different thickness to be made in one operation on a flat gasket, with a view to producing, in a relatively inexpensive manner, high-quality flat gaskets permitting optimal pressure distribution and sealing excellence.

To do so, it is first proposed that a known screen printing stencil for simultaneously making sealing layers consisting of elastomer material on a flat gasket plate, comprising a screen carrying a photoresist layer exhibiting at least one through opening for the elastomer material extending from a doctor blade side to a printing or contacting side of the screen printing stencil, be designed, in accordance with the invention, in such a manner that the photoresist layer in at least one first zone encompassing an opening area for a first sealing layer area of greater height exhibits a greater thickness than in at least one second zone encompassing an opening area for a second sealing layer area of less height, and that the photoresist layer on the one side of the screen printing stencil, in particular, the doctor blade side, is flat, and on the other side of the screen printing stencil, in particular, the printing or contacting side, protrudes with the first zone beyond the second zone. In an inventive screen printing stencil, several zones of the photoresist coating of different thickness may be provided along one or severl through openings, which enables sealing layers whose thickness or height is, consequently, almost optionally variable to be made in one single screen printing procedure. Use of an inventive screen printing stencil therefore not only makes the printing process cheaper, but also improves the quality and precision of the sealing layers since there is no contour misalignment due to use of several stencils and no fault addition or propagation, quite apart from the fact that with the known means and methods it was practically impossible to make sealing layers exhibiting more than two different thicknesses or heights. There is also no need to manufacture and store several screen printing stencils, different screen printing stencils cannot be mistaken for one another, and processing of the elastomer masses which are currently in general use is possible.

If within one sealing layer, a first sealing layer area of greater thickness and a second sealing layer area of less thickness are immediately adjacent to each other, it is recommendable to design the screen printing stencil in such a way that the edge of the first photoresist layer zone, i.e., the photoresist layer zone of greater thickness, runs through the border between the first and the second sealing layer area and, furthermore, encompasses the first sealing layer area in spaced relationship thereto. This results in a sufficiently large and, therefore, reliable layer of the first, thicker photoresist layer zone on the substrate, i.e., the flat gasket plate to be printed.

Thanks to the invention, a method for making an inventive screen printing stencil which can be carried out without expensive accessories for making the stencil, has also been found.

It is based on a known method (see, for example, "Handbuch fuer den Siebdruck" (Screen Printing Handbook), pages 74 to 76, published by Der Siebdruck, Luebeck, Federal Republic of Germany) wherein a photoresist layer is applied onto the entire surface of the screen, dried and exposed through an exposure mask corresponding to the sealing layer configuration, following which the through opening is produced by washing out the photoresist layer material. To make a screen printing stencil in accordance with the invention, such a method is so designed that the first photoresist layer zone is delimited all the way round by applying at least one demarcation member to the printing side of the first photoresist layer first produced throughout the entire surface, following which a second photoresist layer is applied in the first photoresist layer zone to the contacting side of the first photoresist layer, and that the demarcation member is then removed and the two photoresist layers are jointly exposed, following which the through opening is produced by washing out the photoresist layer material. The demarcation member, expediently in the form of an adhesive tape, may, together with the first photoresist layer extending throughout the surface, form a kind of trough which in order to form the second photoresist layer is filled completely or partially with photoresist material (if partially filled, the layer thickness may be set, for example, volumetrically or gravimetrically, whereas if completely filled up, the thickness of the demarcation member determines the thickness of the second photoresist layer). It has, however, proven more advantageous for the demarcation member, such as an adhesive tape, to constitute merely a support for a precision drawn doctor blade whose gap height may be used to determine and set the thickness of the second photoresist layer.

An alternative method for making the screen printing stencil is to apply photofilms of the desired thickness, and, where appropriate, several photofilms in superimposed relationship to one another, to the screen by means of adhesion.

A particularly simple way of delimiting the first photoresist layer zone is to apply, more particularly, by adhesion, to the doctor blade side of the screen provided with the first photoresist layer, a partially transparent foil exhibiting an illustration of the first, i.e., thicker sealing layer area, and in order to apply the demarcation member, i.e., for example, the adhesive tape, to then illuminate the screen printing stencil from the doctor blade side, which is particularly easy to do with an illuminating table, so as to enable precise attachment of the demarcation member on the contacting side of the first photoresist layer, while at the same time taking the sealing layer configuration into consideration.

Further features, advantages and details of the invention are apparent from the appended drawings and the following description of preferred embodiments of the screen printing stencil according to the invention, and of the inventive method for making same. In the drawings:

FIG. 3 shows a section taken along line 3—3 of FIG. 2;

FIG. 4 shows a section taken through part of an inventive screen printing stencil for making the flat gasket shown in FIGS. 2 and 3;

FIG. 5 shows a view of the parts of this screen printing stencil shown in FIG. 4, from below, i.e., in the direction of the arrow "A" in FIG. 4;

Figure 9:
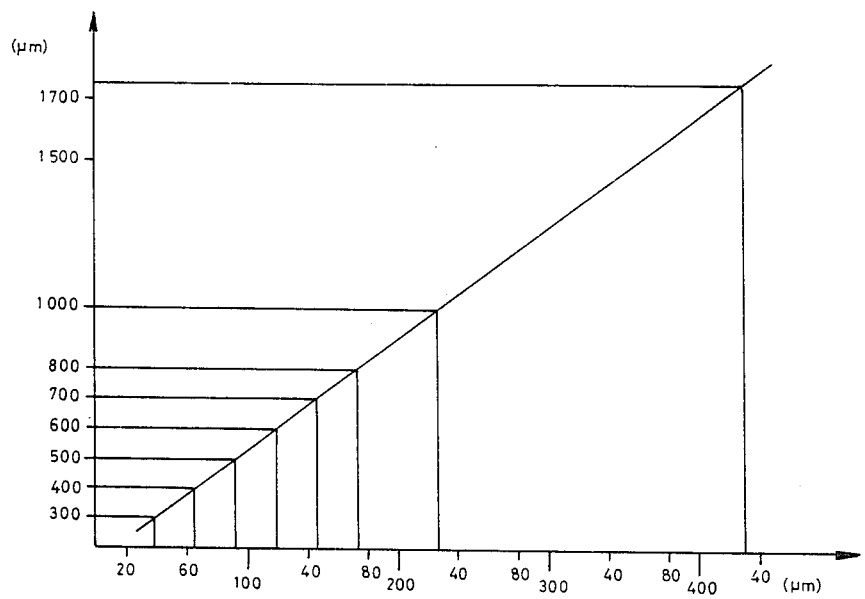

FIG. 6A shows a cross-sectional illustration, corresponding to FIG. 4, of the screen printing stencil shown in FIGS. 4 and 5, however, prior to application of the second photoresist layer, but after application of a transparent drawing by means of adhesion to the doctor blade side of the screen and also after application of the adhesive tapes to the contacting side of the first photoresist layer, in order to delimit the first photoresist layer zone which is to be reinforced, in conformity with the indications given by the transparent drawing;

FIG. 6B shows a view of the parts of the screen printing stencil illustrated in FIG. 6A, from below, i.e., viewed in the direction of the arrow "B" in FIG. 6A;

FIG. 6C shows the areas of the screen printing stencil shown in FIGS. 4 to 6B, in cross-section, more particularly, after the additional coating has been carried out and during the exposure of the two photoresist layers;

FIG. 7 shows a schematic front view of a precision drawn doctor blade for making the second additional photoresist layer;

FIG. 8 shows a schematic cross-sectional view taken through the precision drawn doctor blade according to line 8—8 of FIG. 7; and FIG. 9 shows a calibration curve for setting the gap height of the precision drawn doctor blade in dependence upon the thickness of the second additional photoresist layer to be made (thickness of this photoresist layer in the dried state).

Figure 1:
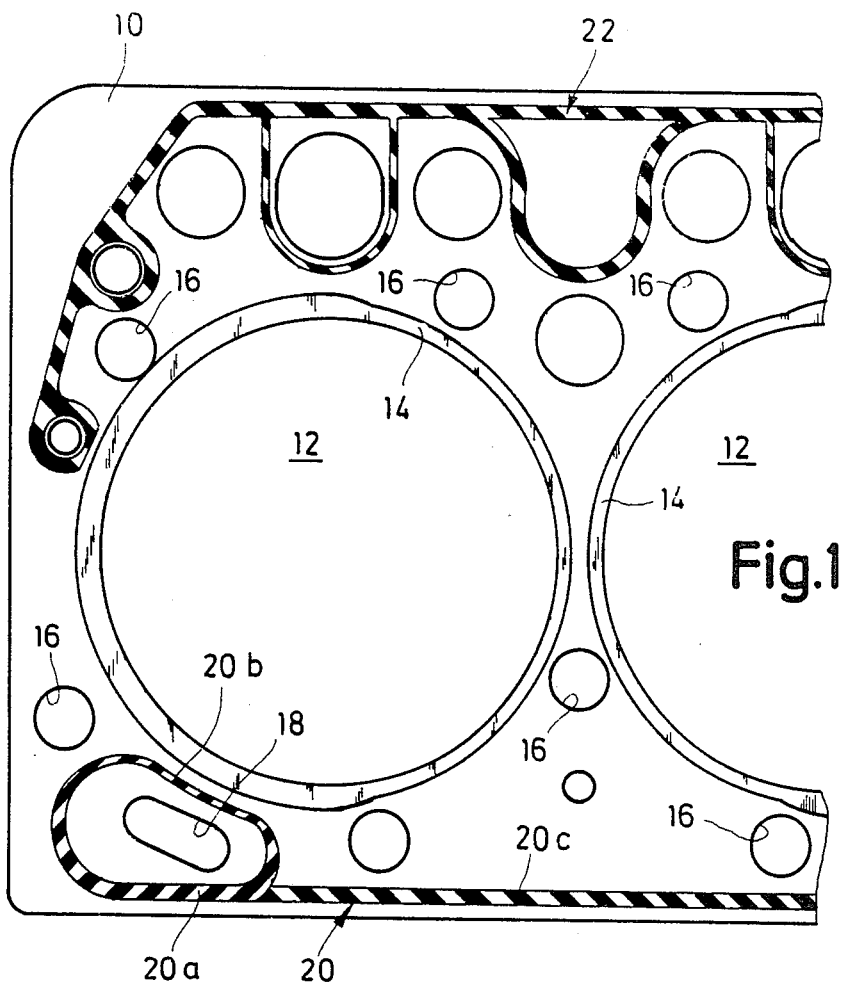
FIG. 1 shows a plan view of part of a cylinder head gasket with sealing layers of different thicknesses.

FIG. 1 shows part of a cylinder head gasket for an internal combustion engine operating with a reciprocating piston, comprising a flat gasket plate 10 having several combustion chamber through openings 12, in the area of which the flat gasket plate is provided with metallic borders 14. The flat gasket plate 10, furthermore, comprises a number of screw through openings 16 and several cooling water through openings, one of which has been designated by reference numeral 18. A number of further through openings will not be described in greater detail as these are not fundamental to an understanding of the invention.

Sealing layers 20 and 22 consisting of elastomer sealing material are disposed on the flat gasket plate 10 along the two longitudinal sides of the cylinder head gasket. In both cases, the sealing layers are in the form of an elongate bead branching off in areas, whose thickness or height, i.e., thickness measured perpendicularly to the plane of the flat gasket plate 10, is not identical throughout. More explicitly, the sealing layer 20, for example, exhibits a sealing layer area 20a denoted by cross-hatching, which has a thickness of 170 μm, while sealing layer areas 20b and 20c denoted by normal hatching, are only 80 μm thick. Accordingly, the cooling water through openings 18 are enclosed by two sealing layer areas 20a and 20b forming a self-contained sealing layer of varying thickness. As is also apparent from FIG. 1, the width of the sealing layer may, of course, also vary along these.

Manufacture of such a flat gasket with the desired precision was not possible at all with the conventional production means and manufacturing methods, and certainly not at a reasonable price.

Figure 2:
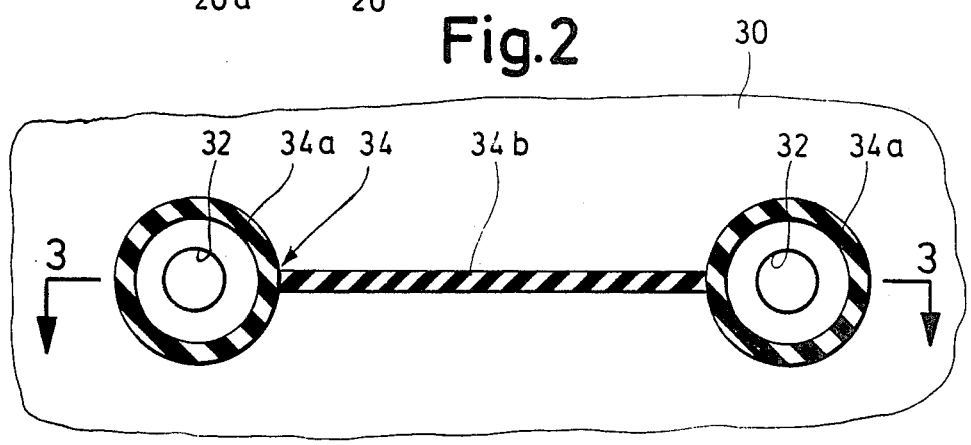
FIG. 2 shows a plan view of an area of another flat gasket with sealing layers of different thicknesses, with this illustration constituting the basis of the following FIGS. 3 to 6.

For reasons of clarity, preferred embodiments of the inventive screen printing stencil and also of the inventive method for its manufacture will now be explained with reference to an area of a flat gasket which is illustrated in FIGS. 2 and 3.

This flat gasket comprises a sealing plate 30 with two through openings 32, arranged in spaced relationship to each other, which may, for example, be holes for passage of coolants or lubricants. A sealing layer 34 consisting of two identical sealing layer areas 34a and a sealing layer area 34b, was applied to one or both sides of the sealing plate 30 in a screen printing process. The sealing layer areas 34a form self-contained circular rings which each surround one of the through openings 32 in spaced relationship thereto and are joined by the sealing layer area 34b. The latter has a thickness of 80 μm, while the sealing layer areas 34a have a thickness of 150 μm. As in the cylinder head gasket of FIG. 1, the ratio of the thicknesses of the sealing layer areas of different heights is, therefore, very roughly 2:1.

FIGS. 4 and 5 show the major parts of a finished screen printing stencil for producing the sealing layer configuration on the flat gasket shown in FIGS. 2 and 3. This screen printing stencil comprises a frame 40 comprised of stripshaped frame legs which, viewed from above, is usually rectangular, and in which a screen consisting of a screen fabric 42 is inserted under tension. The screen fabric is embedded in a first photoresist layer 44, onto whose underside two photoresist layers 46 have been cast, which, together with the first photoresist layer 44, form in the areas defined by the second photoresist layers 46, first thicker photoresist layer zones 50 as defined in the claims. Provided in each of these, in order to produce the sealing layer areas 34a, is a first, annular through opening 48a, and these two through openings are joined by a second through opening 48b serving to produce the sealing layer area 34b. As is clearly apparent from FIGS. 4 and 5, the edge 52 of each of the thicker photoresist layer zones 50 has the shape of an approximately right-angled step, when viewed from the side, or in cross-section. However, in a plan view, the edge 52 constitutes a rectangle, extends through the point at which the through opening 48b runs into the pertinent through opening 48a, and, furthermore, surrounds the through opening 48a in spaced relationship thereto. This produces on either side of the first through opening 48a a good layer of the thicker photoresist layer zones 50 on the flat gasket plate to be printed.

On account of the flexibility of the screen printing stencil, it already rests with the underside of the first photoresist layer 44 at a short distance from the edge 52, on the flat gasket plate to be printed.

The manufacture of the screen printing stencil illustrated in FIGS. 4 and 5 will now be explained in detail.

FIG. 6a again shows the frame 40 which carries the screen fabric, not illustrated in this Figure, with the first photoresist layer 44. The latter has been applied in the conventional manner by means of a doctor blade onto the screen fabric and pressed through the meshes of the screen fabric. After the first photoresist layer 44 has dried, a transparent drawing 60 in which the thicker sealing layer areas 34a (see FIG. 2) are illustrated by markings 34a', is applied by adhesion onto its doctor blade side, i.e., the upper side of FIG. 6A. Following application by adhesion of the transparent drawing 60, the frame 40 is placed onto a conventional illuminating table (not illustrated), more particularly, with its doctor blade or upper side facing downwards, so that the printing side of the screen printing stencil comes up to the top. Adhesive tapes 62 are then applied by adhesion to the photoresist layer 44, more particularly, in such an arrangement that they delimit the thicker photoresist layer zones 50 to be produced (see FIG. 5) on all sides (see FIG. 6B). As previously mentioned, the adhesive tapes 62 together with the photoresist layer 44 form a casting mold having the shape of a flat trough into which a measured amount of the photoresist layer material may now be poured. This amount may be such that the second photoresist layer 46 (see FIG. 4) acquires the desired thickness (in the dried state). A different procedure is, however, also possible, namely that of selecting the thickness of the adhesive tapes 62 such that the casting mold formed thereby is completely filled with photoresist material, in which case the thickness of the adhesive tapes 62 must correspond to the thickness of the second photoresist layer 46. An embodiment of the inventive method, wherein a precision drawn doctor blade, whose gap height is set so as to produce a second photoresist layer 46 of the desired thickness, is guided over the upwardly oriented adhesive tapes 62, is, however, preferred. In this case, the adhesive tapes 62 constitute only a bearing for the precision drawn doctor blade and serve only to delimit the outline of the thicker photoresist layer zone 50 to be produced (see FIG. 5) or of the second photoresist layer 46 (see FIG. 4). In order to prevent sagging of the screen fabric during application of the photoresist layer by means of a precision drawn doctor blade, it is supported from the doctor blade side by placing a glass plate or the like, not illustrated, underneath.

After the thus produced second photoresist layer 46 has dried, the adhesive tapes 62 are removed again, and the transparent drawing 60 is also removed.

The design of the screen printing stencil is then that shown in cross-section in FIG. 6C, where the screen is designated together with the two photoresist layers as an entity by reference numeral 66. To expose this raw stencil 66, there is now attached to its upper or doctor blade side an exposure stencil 68 through which the raw stencil is exposed from above (see arrow "L" in FIG. 6C). As is known, the exposure stencil 68 is designed so as to exhibit transparent areas 68a and non-transparent areas 68b, with the latter having a configuration corresponding to the configuration of the sealing layer areas 34a and 34b (see FIG. 2), at any rate, on the condition that a photoresist material which is cured by exposure has been used (there are also photoresists which behave in the reverse manner, i.e., which are brought by exposure into a state wherein the photoresist material can be dissolved by water and washed out). The exposure stencil 68 is then removed, whereupon those areas of the photoresist material of the raw stencil 66 which previously lay underneath the non-transparent areas 68b, i.e., were not exposed, are washed out with water, which produces the screen printing stencil configuration illustrated in FIGS. 4 and 5.

With this screen printing stencil it is now possible, in one single operation, i.e., with the conventional screen printing method, to provide the flat gasket with sealing layers of different thicknesses, which produces the finished flat gasket illustrated in FIGS. 2 and 3.

Although precision drawn doctor blades belong to the state of the art, such a precision drawn doctor blade will be explained briefly and very schematically with reference to FIGS. 7 and 8: The doctor blade designated in its entirety by reference numeral 100 has the shape of a frame-type casing open at the top and bottom, with a bottom edge 102, which together with a recess 105a in a front end wall 104 defines a gap 106 when the doctor blade rests on a flat surface. When the doctor blade is turned round, a second recess 105b defines, together with a casing upper edge 103, a gap 107 of a different height or width. For reasons of clarity, the gaps are illustrated in the drawings with a highly magnified width or height. To apply the photoresist material, it is filled into the casing of the doctor blade 100 resting on the base to be coated and the doctor blade is then passed over the area to be coated. In principle, partial application of the photoresist layer is, however, possible with various film drawing apparatus systems, e.g., with infinitely adjustable film drawing apparatus (Erichsen GmbH & Co. KG, 5870 Hemer, Federal Republic of Germany, Model 411), with spiral film drawing apparatus (Erichsen, Model 358), with varnish layer spreaders (Wasag system, Model 288), with multiple film drawing frames (Model 360), etc. For reasons of simplicity, the term "doctor blade" is used for all suitable film drawing apparatus.

To ascertain the connection between the height "h" of the gap 106, 107, respectively, and the thickness of the dried photoresist layer applied with the doctor blade, it is expedient to first compile a calibration curve, as reproduced in FIG. 9. The gradient of the calibration curve depends on various parameters such as, for example, the thickness of the adhesive tapes 62, the consistency of the photoresist material (solid matter content, viscosity, etc.), the speed at which the doctor blade is made to pass over the zones to be coated, etc.

With the aid of a transparent drawing such as the transparent drawing 60 or an equivalent technical aid, and an illuminating table, the zones to be coated in addition can be delimited by means of the adhesive tapes 62 with an accuracy of approximately ±0.5 mm.

The transparent drawing 60 and the exposure stencil 68 must, of course, be fitted exactly onto the screen printing stencil, and the transparent drawing 60 is removed prior to exposure of the photoresist layers.

Since thicker photoresist layers require longer exposure times than thinner layers, the exposure time should be set so as to be adequate for the largest thickness of the raw stencil 66 (see FIG. 6C). In order to avoid harmful overexposure of the thinner areas of the photoresist layer, it is preferable to use a photoresist which is insensitive to such overexposure.

If the precision drawn doctor blade is operated manually, the thickness of the dry photoresist layer may be adhered to with an accuracy of ±10%. With a precision drawn doctor blade which is operated by an electric motor, however, an accuracy of ±2% is possible.

Particularly well suited is a photoresist material obtainable from Kissel & Wolf under the name of KIWO-COL 31, a trademark of the German company Kissel & Wolf, whose solid matter content is approximately 33% and which is aqueous. With this photoresist material, layer thicknesses of between 10 and 500 μm can be produced.

Aluminum-vapour-deposited polyester adhesive tapes with a thickness of preferably 50 μm are particularly well suited for the adhesive tapes 62 and provide good gliding surfaces for the precision drawn doctor blade.

The invention does, of course, also enable several sealing layers of different thickness, which are not coherent, to be simultaneously produced in one single screen printing procedure.

What is claimed is:

1. Method of making a screen printing stencil comprising an upper or doctor blade side as well as a lower or printing side for producing a sealing layer configuration of elastomer material of varying thickness on a flat gasket plate, wherein a photoresist layer is applied to a first surface of a screen, dried and exposed through an exposure mask corresponding to the sealing layer configuration, whereupon at least one through opening for the elastomer material is produced by washing out the photoresist material, characterized in that for producing at least one first zone of the photoresist layer enclosing an opening area for producing a first sealing layer area of a greater height as well as at least one second zone of the photoresist layer enclosing an opening area for a second sealing layer area of lesser height, a first photoresist layer is produced over the entire first surface of the screen whereupon the first photoresist layer is dried, said first photoresist layer zone being then delimited all the way round by applying at least one demarcation member to the printing side of said first photoresist layer whereupon a second photoresist layer is applied to the printing side of the first photoresist layer in the first photoresist layer zone within the boundaries of the demarcation member, and that then the second photoresist layer is dried and said demarcation member is removed, whereupon said mask is applied to said two photoresist layers which are then jointly exposed through said mask, whereupon the through-opening is produced by washing out the photoresist material.

2. Method as defined in claim 1, characterized in that an adhesive tape is used as demarcation member.

3. Method as defined in claim 1, characterized in that a partially transparent foil exhibiting an illustration of the first sealing layer area is applied to the doctor blade side of the screen provided with the first photoresist layer, and that the screen printing stencil is then illuminated from the doctor blade side in order to apply the demarcation member.

4. Method as defined in claim 1, characterized in that the second photoresist layer is applied by means of a precision draw doctor blade guided over the demarcation member.

* * * * *